(12) United States Patent
Zhao et al.

(10) Patent No.: US 7,249,273 B2
(45) Date of Patent: Jul. 24, 2007

(54) SYNCHRONIZED SERIAL INTERFACE

(75) Inventors: Chengting Zhao, Chandler, AZ (US);
Ashish Gupta, San Jose, CA (US);
Edward R. Helder, Fremont, CA (US);
Fangxing Wei, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 773 days.

(21) Appl. No.: 10/601,502

(22) Filed: Jun. 23, 2003

(65) Prior Publication Data

US 2004/0260961 A1 Dec. 23, 2004

(51) Int. Cl.
*H04L 7/00* (2006.01)
(52) U.S. Cl. ....................................... 713/400
(58) Field of Classification Search ................. 713/500
See application file for complete search history.

(56) References Cited

U.S. PATENT DOCUMENTS

| | | | | |
|---|---|---|---|---|
| 4,004,090 A | * | 1/1977 | Goto et al. ................. | 375/373 |
| 4,218,742 A | * | 8/1980 | Carlton et al. ................. | 710/71 |
| 4,901,076 A | * | 2/1990 | Askin et al. ................. | 341/100 |
| 5,134,702 A | * | 7/1992 | Charych et al. .............. | 710/71 |
| 5,359,630 A | * | 10/1994 | Wade et al. ................. | 375/354 |
| 6,184,808 B1 | * | 2/2001 | Nakamura .................... | 341/95 |

* cited by examiner

*Primary Examiner*—Rehana Perveen
*Assistant Examiner*—Eric Chang
(74) *Attorney, Agent, or Firm*—Buckley, Maschoff & Talwalker LLC

(57) ABSTRACT

Some embodiments provide a synchronization circuit to receive a synchronization signal, the synchronization signal substantially synchronized with a data transition, to synchronize the synchronization signal with a clock signal, and to generate a load signal based on the synchronized synchronization signal. Also provided may be a ring counter to receive the load signal from the synchronization circuit and to circularly propagate the load signal.

27 Claims, 5 Drawing Sheets

SYNCHRONIZED SERIAL INTERFACE

BACKGROUND

Parallel-to-serial converters receive data from parallel signal lines and output the data in serial form. Many of these converters operate in conjunction with a "load" signal. In one example of operation, a load signal is asserted and one data bit from each parallel signal line is loaded into a respective state element of a parallel-to-serial converter. The data bits are loaded at an edge of a high-speed I/O clock signal that follows the assertion of the load signal. After the load signal is deasserted, the data bits are shifted through the state elements with each subsequent rising edge of the high-speed I/O clock signal.

A timing of the load signal may therefore be based on the high-speed I/O clock signal and on a frequency of the data carried by the parallel signal lines. Many conventional devices generate the load signal by scaling down the high-speed I/O clock signal via a phase-lock loop and transmit the generated load signal to one or more parallel-to-serial converters. Such a load signal may be skewed with respect to its desired timing when it arrives at a converter. Moreover, many conventional devices fail to provide a system to adjust a timing of a previously-generated load signal.

DETAILED DESCRIPTION

Figure 1:
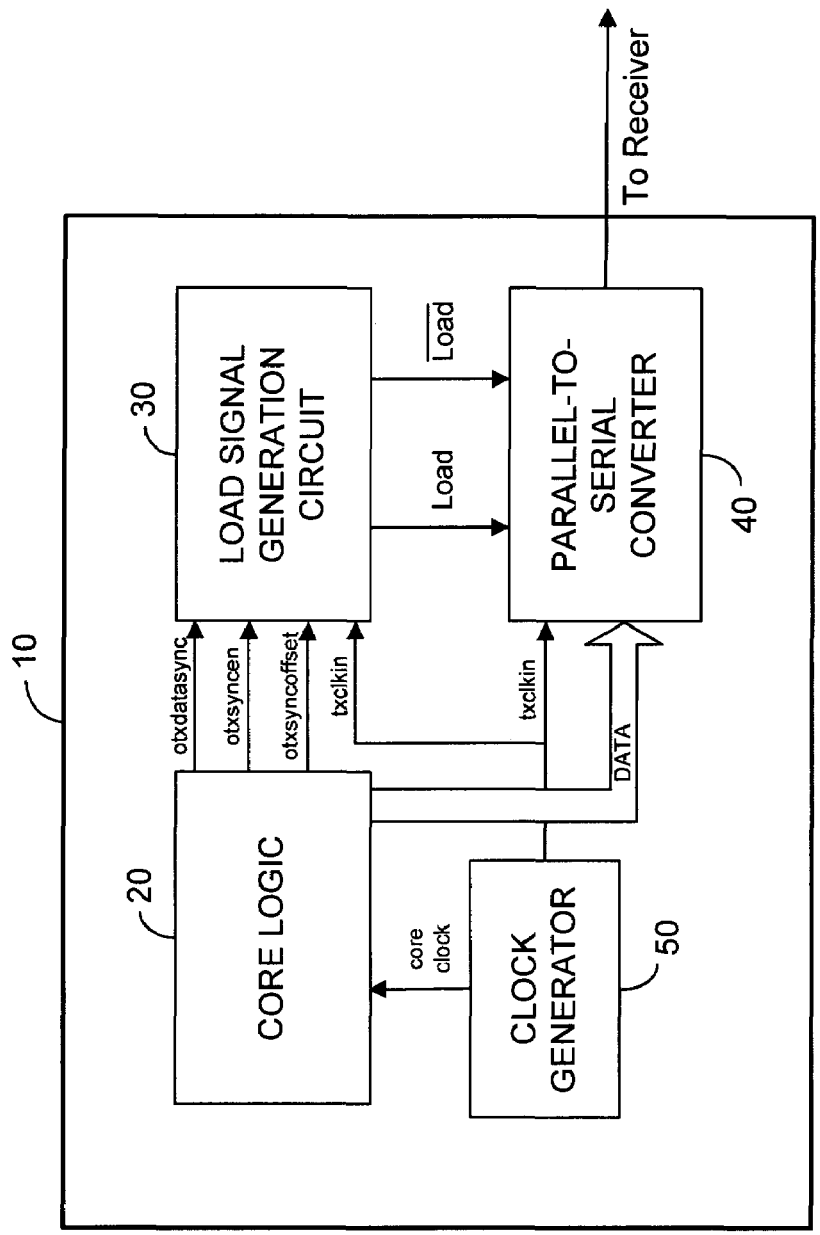
FIG. 1 is a block diagram of a device according to some embodiments.

FIG. 1 is block diagram of device 10 according to some embodiments. Device 10 may comprise a high-speed serial data transmitter, and/or an element of a chipset that provides several interfaces, at least one of which is a serial transmitter. In one specific example, device 10 is a Memory Controller Hub (MCH), which exchanges parallel data with one or more processors via a system bus and exchanges serial data with one or more memory elements, controller hubs, and/or other elements. Generally, device 10 may comprise any device or devices to convert parallel data to serial data in conjunction with a load signal.

Device 10 comprises core logic 20, load signal generation circuit 30 parallel-to-serial converter 40, and clock generator 50. Core logic 20 may provide core functionality to device 10. Core logic 20 also transmits three control signals to load signal generation circuit 30. These signals include a synchronization signal (otxdatasync), a calibration enable signal (otxsncen), and a timing offset signal (otxsyncoffset). Briefly, the synchronization signal may be substantially synchronized with the data, the calibration enable signal may be asserted to calibrate load signal generation circuit 30 and deasserted to generate the load signal for output, and the timing offset may be used to select a load signal having a particular timing with respect to the data. One or more of these signals may be generated by core logic 20 in accordance with some embodiments.

Core logic 20 transmits 8-bit parallel data to converter 40. Other data bus widths may be used in conjunction with some embodiments. A minimum data transition period of the 8-bit parallel data may be equal to eight times the high-speed I/O clock signal period. Accordingly, the data rate of the 8-bit parallel data may be one-eighth of the high-speed I/O clock signal frequency.

Clock generator 50 transmits high-speed I/O clock signal txclkin to load signal generation circuit 30 and to parallel-to-serial converter 40. High-speed I/O clock signal txclkin may be generated by any currently- or hereafter-known system. In some embodiments, the frequency of the high-speed I/O clock signal is 2.67 GHz. The data frequency may therefore be 333.33 MHz based on the above example values.

In one example of operation, load signal generation circuit 30 receives the synchronization signal from core logic 20. The synchronization signal may be substantially synchronized with data that is transmitted from core logic 20 to parallel-to-serial converter 40. Load signal generation circuit 30 also receives the high-speed I/O clock signal from clock generator 50 and synchronizes the synchronization signal with the high-speed I/O clock signal.

Load signal generation circuit 30 generates a load signal based on the synchronized synchronization signal. The generated load signal includes a load pulse, which may comprise a transition from a first logic level to a second logic level, a period at the second logic level, and a transition back to the first logic level. The period at the second logic level may be equal to a period of the high-speed I/O clock signal. As will be described in detail below, load signal generation circuit 30 may include a ring counter of one or more delay elements.

According to the present example, the load signal is input into the open-loop ring counter, wherein a time for the load pulse to propagate completely through the ring counter is substantially equal to the minimum data transition period. The load signal is output from a first node of the ring counter, and a period between successive outputs of the load pulse is substantially equal to the minimum data transition period. The output load signal is received by parallel-to-serial converter 40, which may serialize the data received from core logic 20 based on the received successive load pulses.

Figure 2:
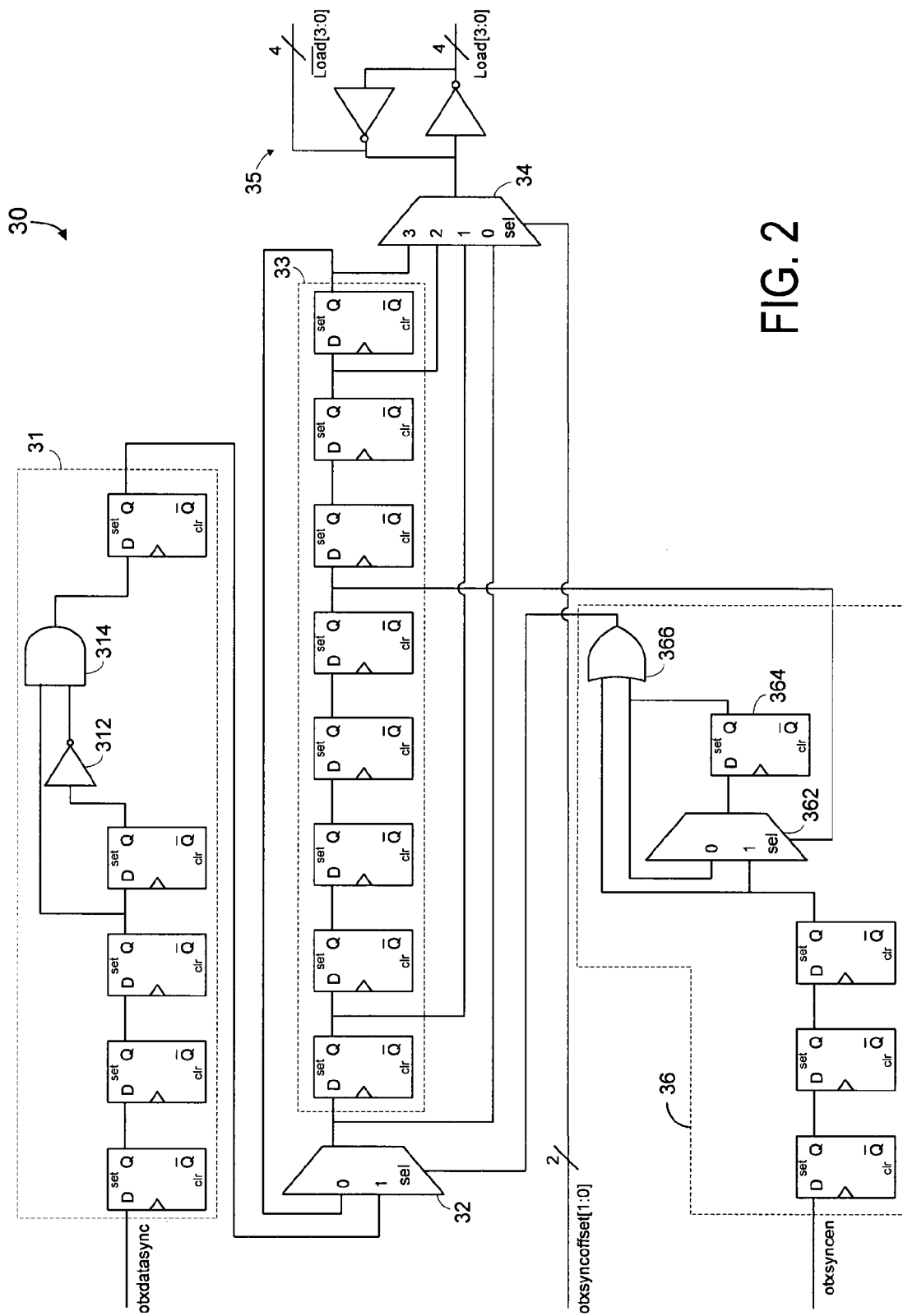
FIG. 2 is a schematic diagram of a load signal generation circuit according to some embodiments.

FIG. 2 is a schematic diagram of load generation circuit 30 according to some embodiments. As shown, load generation circuit 30 may comprise synchronization circuit 31, multiplexer 32, ring counter 33, multiplexer 34, output buffer 35, and enabling circuit 36.

Synchronization circuit 31 receives the synchronization signal (otxdatasync) from core logic 20, synchronizes the synchronization signal with the high-speed I/O clock signal (txclkin), and generates a load signal based on the synchronized synchronization signal. Ring counter 33 receives the load signal from synchronization circuit 31 and circularly propagates the load signal under control of multiplexer 32. In this regard, multiplexer 32 receives an enable signal, a load signal from synchronization circuit 31 and a signal output from ring counter 33. Multiplexer 32 outputs the load signal received from synchronization circuit 31 to ring counter 33 if the enable signal is asserted and outputs the signal received from the output of ring counter 33 if the enable signal is deasserted. Therefore, ring counter 33 receives a load signal from synchronization circuit 31 while the enable signal is asserted and circularly propagates the received signal once the enable signal is deasserted.

Enabling circuit 36 outputs the enable signal to multiplexer 32. Enabling circuit 36 asserts and deasserts the enable signal based on the calibration enable signal (otxsyncen) received from core logic 20 and on whether ring counter 33 has received a load pulse of the load signal. Generally, enabling circuit 36 detects whether a load pulse of the load signal have been received by ring counter 33, and deasserts the enable signal if ring counter 33 has been received the load pulse.

Ring counter 33 includes several delay elements, which are illustrated in FIG. 2 as D-type flip-flops. Multiplexer 34 receives a circularly propagating load signal from two or more of the delay elements. Since each delay element delays the load signal, the received load signals are delayed with respect to each other. Multiplexer 34 also receives the offset signal (otxsyncoffset) from core logic 20. Multiplexer 34 selects one of the received load signals to output based on the 2-bit offset signal. The selected load signal is output to output buffer 35. Output buffer 35 generates four separate differential signal pairs based on the selected load signal, with each signal pair representing the selected load signal.

Figure 3A:
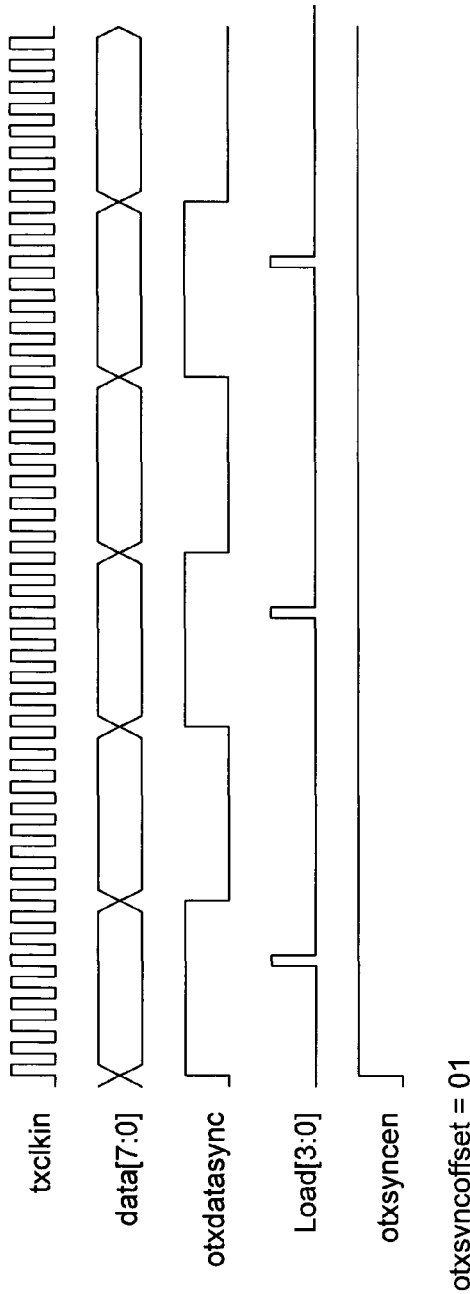
FIGS. 3A and 3B are diagrams of signal timings according to some embodiments.

In more detail, synchronization circuit 31 comprises a plurality of delay elements, inverter 312 and AND gate 314. Each delay element of circuit 31, and of circuit 30, is clocked by the high-speed I/O clock signal received from clock generator 50. In operation, a first delay element of circuit 30 receives the synchronization signal otxdatasync. As described above, the synchronization signal may be substantially synchronized with data that is transmitted from core logic 20 to parallel-to-serial converter 40. The synchronization signal may have a transition rate equal to the maximum transition rate of data transmitted to converter 40. FIG. 3A illustrates a relationship between the synchronization signal received by the first delay element and the data period according to some embodiments.

The first delay element synchronizes the synchronization signal with the high-speed I/O clock signal. Moreover, the first delay element delays the synchronization signal for one clock period with respect to the data period. After two subsequent cycles of the high-speed I/O clock signal, the synchronization signal is output by the third delay element of synchronization circuit 31. The output synchronization signal is therefore delayed by three clock periods with respect to the data period.

The output synchronization signal is received by one terminal of AND gate 314 of synchronization circuit 31. The output synchronization signal is also received by a fourth delay element, which delays the output synchronization signal by one high-speed I/O clock period. The fourth delay element outputs the delayed synchronization signal to inverter 312, which inverts the delayed synchronization signal. AND gate 314 thereafter performs a logical AND operation on the inverted delayed synchronization signal and the synchronization signal that was output from the third delay element. These two signals are delayed from one another by one clock period. Accordingly, the output of AND gate 314 is a load signal that includes a pulse having a width of one clock period, a frequency equal to a frequency of the synchronization signal, and a duty cycle of 6.25%.

The load signal is re-synchronized with the high-speed I/O clock signal and delayed by an additional clock period by a next delay element of circuit 31. The load signal that is output from the fourth delay element is therefore delayed by four high-speed I/O clock periods with respect to the data transition. FIG. 3A illustrates one such load signal (Load[3:0]) according to some embodiments. As shown in FIG. 3A, the load pulse of the load signal is delayed by four periods of txclkin with respect to data [7:0].

The signal timings of FIG. 3A represent a "calibration" mode of circuit 30. More particularly, the signal timings represent an operation of circuit 30 while an enable signal received by multiplexer 32 is asserted. In this regard, FIG. 3A illustrates assertion of the calibration enable signal (otxsyncen) upon which the enable signal is based. During the calibration mode, the load signal generated by synchronization circuit 31 passes serially through the delay elements of ring counter 33 but does not circularly propagate therethrough.

As mentioned above, multiplexer 34 receives the output of four delay elements of ring counter 33 and selects one for output. The output load signal is shown as Load[3:0] in FIG. 3A in a case that the offset signal is $01_2$. In the present embodiment, this offset signal indicates that multiplexer 34 should select the output of the first delay element for output. As shown in FIG. 3A, the load pulse of the selected load signal is offset from the data period by five high-speed I/O clock periods. The load signal that is output by each delay element of ring counter 33 during calibration mode is similar to the signal Load[3:0] of FIG. 3A, although the signals are delayed with respect to one another.

Enabling circuit 36 asserts the enable signal and thereby causes circuit 30 to operate in calibration mode in response to the assertion of the calibration enable signal otxsyncen. The calibration enable signal is received by three delay elements of enabling circuit 36 and is thereby delayed by three high-speed I/O clock periods. The three delay elements, as well as the three initial delay elements of synchronization circuit 31, may reduce metastability issues within circuit 30. In this regard, some embodiments include more than three delay elements at the input of enabling circuit 36 and circuit 31.

Multiplexer 362 receives the delayed calibration enable signal and also receives a load signal that is output from the fifth delay element of ring counter 33. As a result of the illustrated connections between multiplexer 362, delay element 364 and OR gate 366, the enable signal output by OR gate 366 is asserted upon receiving an asserted calibration enable signal. Multiplexer 32 therefore inputs a load signal from circuit 31 into ring counter 33. The enable signal remains asserted even if the calibration enable signal is then deasserted. The enable signal remains asserted until the load pulse is propagated to the fifth delay element of ring counter 33. Next, load signal generation circuit 30 switches to "run" mode, as depicted in FIG. 3B.

Figure 3B:
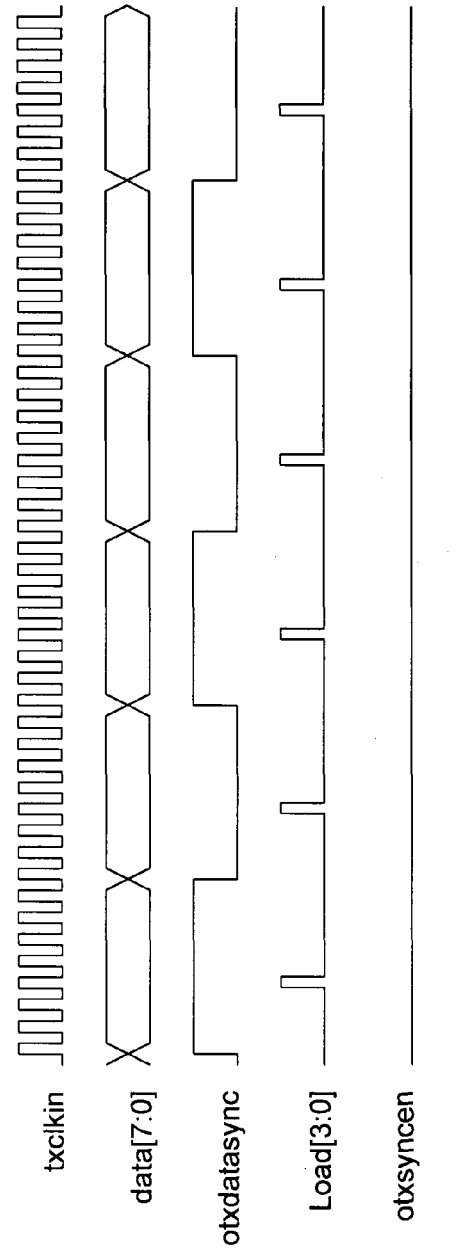

FIG. 3B illustrates signal timings during the "run" mode of circuit 30 according to some embodiments. The run mode is executed after the above-described enable signal is deasserted. As a result, multiplexer 32 transmits a load signal output by ring counter 33 to an input of ring counter 33. This transmission causes a load pulse to circularly propagate through ring counter 33.

A frequency of the load pulse at the output of each delay element of ring counter 33 is substantially equal to a data rate. Also, as shown in FIG. 3B, a duty cycle of the load pulse is 12.5%. An offset signal value of $10_2$ is reflected in FIG. 3B. In the illustrated embodiment, such an offset signal instructs multiplexer 34 to output the load signal that is output from the seventh delay element of ring counter 33. Since the load signal input to ring counter 33 is delayed by four high-speed I/O clock cycles with respect to the data period, the load signal output from the seventh delay element is delayed by eleven high-speed I/O clock cycles.

Since the data period repeats every eight high-speed I/O clock cycles, the effective delay of the load signal is three high-speed I/O clock cycles.

The offset signal may comprise more than two bits and may therefore allow multiplexer 34 to select a load signal that is output from any delay element of ring counter 33. The offset signal may be used to ensure that the load pulse of a load signal output from circuit 30 is substantially synchronized with a middle portion of the data eye. Such synchronization increases the accuracy of parallel-to-serial data conversion that is based on the load signal.

Figure 4:
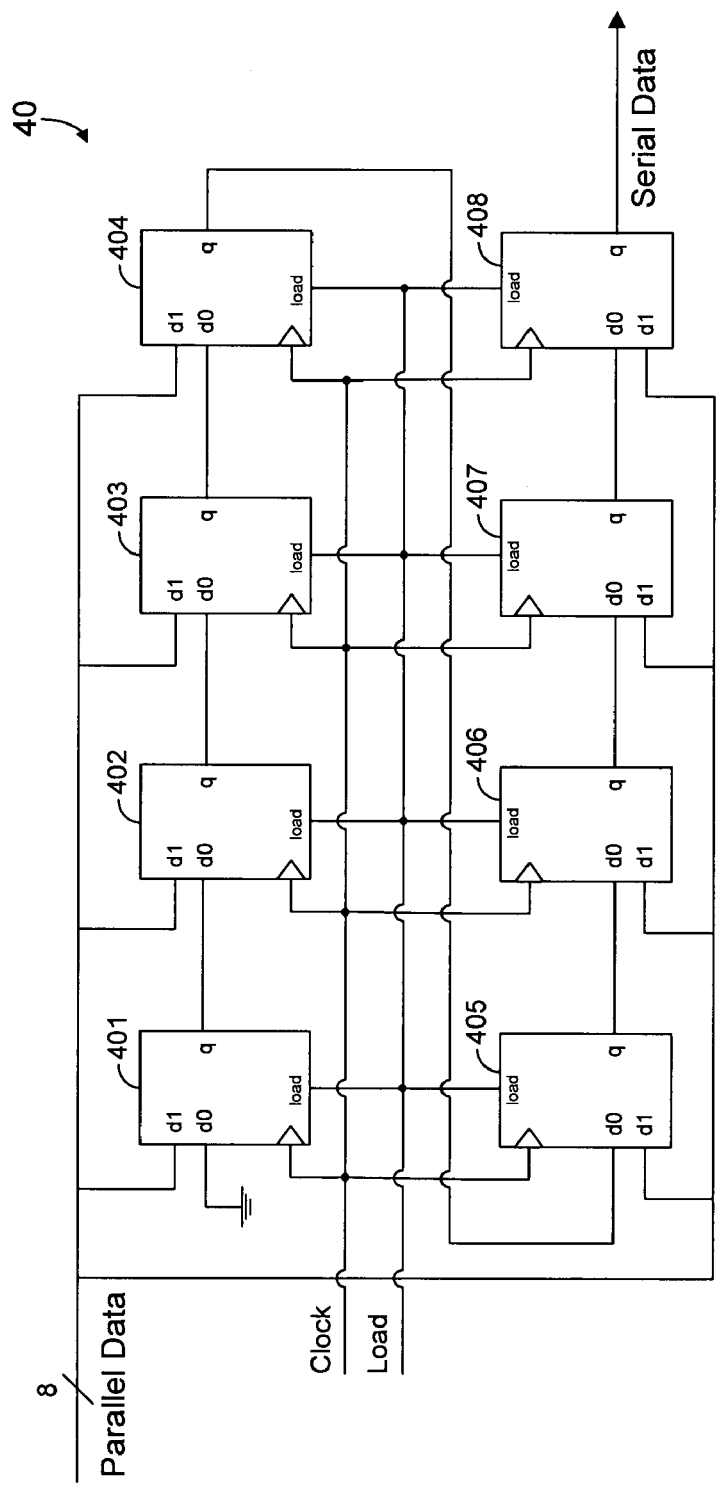
FIG. 4 is a schematic diagram of a parallel-to-serial converter according to some embodiments.

FIG. 4 is a schematic diagram of parallel-to-serial converter 40 according to some embodiments. Each of latches 401 through 408 is clocked by the high-speed I/O clock signal and receives data from an associated one of eight signal lines carrying parallel data. Although FIG. 4 shows one single-ended load signal line, some embodiments share one of the above-mentioned four differential load signal pairs between a respective two of latches 401 through 408.

The load pulse causes each latch to load one bit of data and a simultaneous clock signal causes each latch to present the loaded data at its output node. Latches 401 through 408 then shift the eight loaded data bits serially out from circuit 40 in response to a next seven clock signals. A next load pulse is delivered to the latches along with a next clock signal, and the process repeats for a next eight bits of data.

Figure 5:
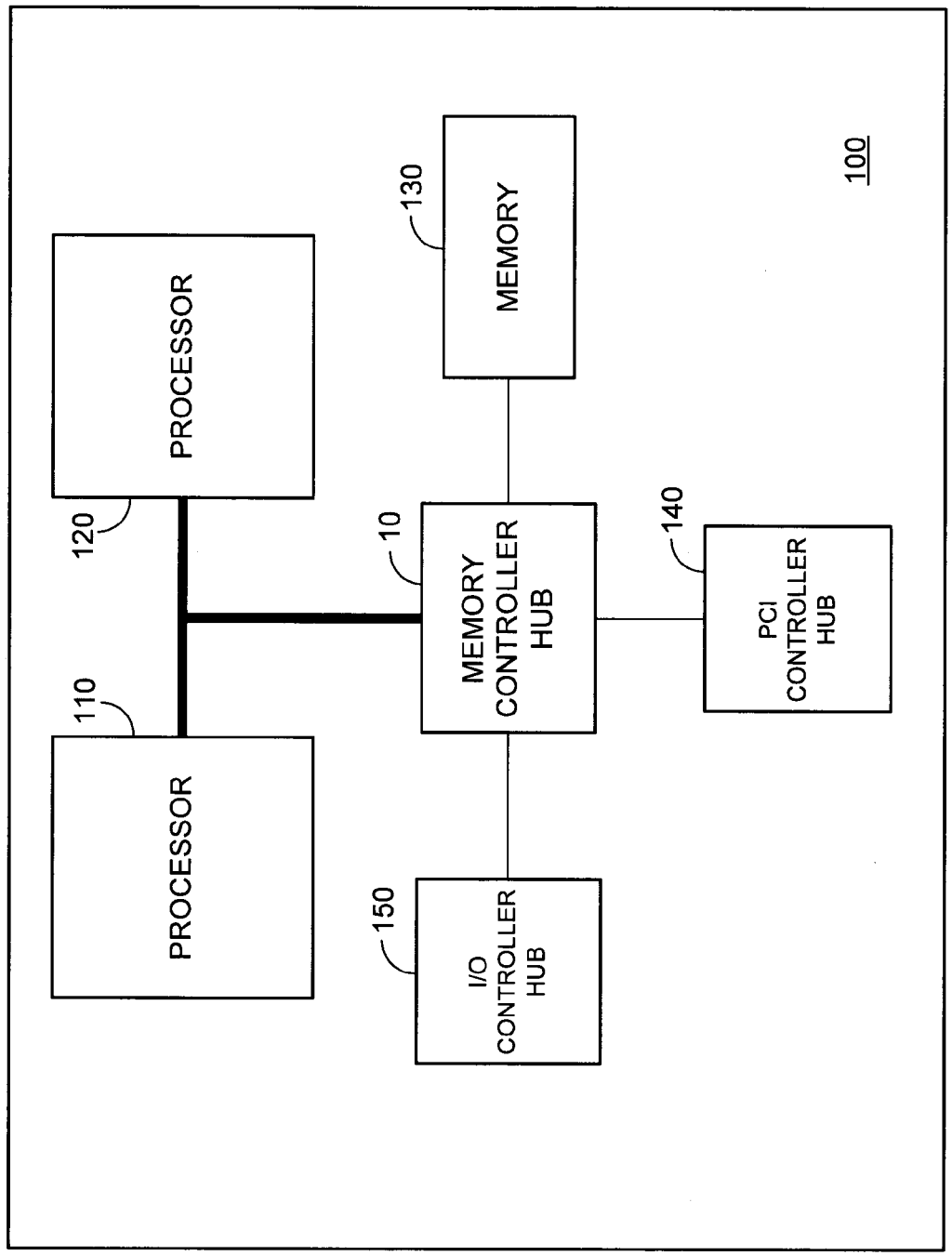
FIG. 5 is a block diagram of a motherboard according to some embodiments.

FIG. 5 is a block diagram of system 100 according to some embodiments. System 100 may comprise a server motherboard. As shown, system 100 comprises a dual-processor platform.

In this regard, processors 110 and 120 communicate with each other and with device 10 over system bus interface. Device 10 comprises a memory controller hub including interfaces for communication over various hardware and/or software protocols. One such interface may comprise a high-speed serial interface, such as SciDLink or 3GIO. A transmitter of the high-speed serial interface may include circuit 30 and converter 40 as described above. The high-speed serial interface may be used to exchange data with memory 130.

Memory 130 may comprise a Double Data Rate Random Access Memory (DDR RAM), a Single Data Rate Random Access Memory (SDR RAM) or any other suitable memory. Device 10 may also support various versions of the Hub Interface to communicate with PCI controller hub 140 and I/O hub controller 150. Elements 10, 140 and 150 may comprise a chipset such as the Intel™ E7501 chipset or any other chipset.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A device comprising:
   a synchronization circuit to receive a synchronization signal, the synchronization signal substantially synchronized with a data transition, to synchronize the synchronization signal with a clock signal, and to generate a load signal based on the synchronized synchronization signal; and
   a ring counter to receive the load signal from the synchronization circuit and to circularly propagate the load signal; and
   a multiplexer to receive a plurality of delayed load signals from the ring counter, to receive an offset signal, and to output one of the plurality of delayed load signals based on the offset signal.

2. A device comprising:
   a synchronization circuit to receive a synchronization signal, the synchronization signal substantially synchronized with a data transition, to synchronize the synchronization signal with a clock signal, and to generate a load signal based on the synchronized synchronization signal;
   a ring counter to receive the load signal from the synchronization circuit and to circularly propagate the load signal; and
   an enabling circuit to assert and to deassert an enable signal,
   wherein the ring counter is to receive the enable signal, to receive the load signal from the synchronization circuit if the enable signal is asserted, and to circularly propagate the load signal if the enable signal is deasserted.

3. A device according to claim 2, wherein the enabling circuit comprises
   a circuit to detect whether a load pulse within the load signal has been received by the ring counter, and to deassert the enable signal if the load pulse has been received by the ring counter.

4. A device comprising:
   a synchronization circuit to receive a synchronization signal, the synchronization signal substantially synchronized with a data transition, to synchronize the synchronization signal with a clock signal, and to generate a load signal based on the synchronized synchronization signal;
   a ring counter to receive the load signal from the synchronization circuit and to circularly propagate the load signal, wherein the ring counter comprises one or more delay elements to receive the load signal, to delay the load signal, and to output the delayed load signal, the clock signal to reflect a clock period, and each of the one or more delay elements to delay the load signal for a respective period substantially equal to an integer multiple of the clock period; and
   a multiplexer to receive a delayed load signal from a plurality of the one or more delay elements, to receive an offset signal, and to output one of the received delayed load signals based on the offset signal.

5. A device comprising:
   a synchronization circuit to receive a synchronization signal, the synchronization signal substantially synchronized with a data transition, to synchronize the synchronization signal with a clock signal, and to generate a load signal based on the synchronized synchronization signal;
   a ring counter to receive the load signal from the synchronization circuit and to circularly propagate the load signal; and
   a multiplexer to receive the load signal from the synchronization circuit, to receive a circularly propagating load signal from the ring counter, to receive an enable signal, to output the received load signal to the ring counter if the enable signal is asserted, and to output the circularly propagating load signal to the ring counter if the enable signal is deasserted.

6. A device according to claim 5, further comprising:
   an enabling circuit to detect whether a load pulse of the load signal has been received by the ring counter, and to deassert the enable signal only if the load pulse has been received by the ring counter.

7. A device comprising:
a synchronization circuit to receive a synchronization signal, the synchronization signal substantially synchronized with a data transition, to synchronize the synchronization signal with a clock signal, and to generate a load signal based on the synchronized synchronization signal;
a ring counter to receive the load signal from the synchronization circuit and to circularly propagate the load signal; and
wherein the synchronization circuit comprises:
a delay element to delay the synchronized synchronization signal;
an inverter to invert the delayed synchronized synchronization signal; and
a logic element to AND the delayed inverted signal and the synchronized synchronization signal, and to output the load signal.

8. A method comprising:
receiving a synchronization signal, the synchronization signal substantially synchronized with a data transition;
synchronizing the synchronization signal with a clock signal;
generating a load signal based on the synchronized synchronization signal, the load signal including a load pulse;
inputting the load signal into a ring counter of one or more delay elements, a time for the load pulse to propagate completely through the ring counter being substantially equal to a minimum data transition period; and
outputting the load signal from a first node of the ring counter, a period between successive outputs of the load pulse being substantially equal to the data transition period.

9. A method according to claim 8, wherein the synchronization signal is synchronized with a data signal, the data signal reflecting the minimum data transition period.

10. A method according to claim 9, wherein the period of the synchronization signal is substantially equal to the data transition period.

11. A method according to claim 8, wherein generating the load signal comprises:
delaying the synchronized synchronization signal;
inverting the delayed synchronized synchronization signal; and
performing a logical AND operation on the delayed inverted signal and the synchronized synchronization signal to generate the load signal.

12. A method according to claim 11, wherein the inverted signal is delayed by one period of the clock signal.

13. A method according to claim 8, wherein outputting the load signal from the ring counter comprises:
receiving a plurality of load signals from the ring counter, at least one of the plurality of load signals being delayed with respect to at least one other of the plurality of load signals;
selecting one of the plurality of load signals to output; and
outputting the selected load signal.

14. A method according to claim 13, wherein a load pulse of the selected load signal is substantially synchronized with a center of the data eye.

15. A method according to claim 13, wherein selecting one of the plurality of load signals comprises:
receiving an offset signal;
selecting a load signal output from one of the one or more delay elements based on the offset signal.

16. A method according to claim 8, wherein inputting the load signal comprises:
asserting an enable signal to input the load signal into the ring counter, and further comprising:
deasserting the enable signal to shift the load signal through the ring counter.

17. A device to:
receive a synchronization signal, the synchronization signal substantially synchronized with a minimum data transition period;
synchronize the synchronization signal with a clock signal;
generate a load signal based on the synchronized synchronization signal, the load signal including a load pulse;
input the load signal into a ring counter of one or more delay elements, a time for the load pulse to propagate completely through the ring counter being substantially equal to the minimum data transition period; and
output the load signal from a first node of the ring counter, a period between successive outputs of the load pulse being substantially equal to the minimum data transition period.

18. A device according to claim 17, the synchronization signal to be synchronized with a data signal, the data signal to reflect the minimum data transition period.

19. A device according to claim 18, the period of the synchronization signal to be substantially equal to the data transition period.

20. A device according to claim 17, wherein generation of the load signal comprises:
delay of the synchronized synchronization signal;
inversion of the delayed synchronized synchronization signal; and
performance of a logical AND operation on the delayed inverted signal and the synchronized synchronization signal to generate the load signal.

21. A device according to claim 20, the inverted signal to be delayed by one period of the clock signal.

22. A device according to claim 17, wherein output of the load signal from the ring counter comprises:
reception of a plurality of load signals from the ring counter, at least one of the plurality of load signals to be delayed with respect to at least one other of the plurality of load signals;
selection of one of the plurality of load signals to output; and
output of the selected load signal.

23. A device according to claim 22, wherein a load pulse of the selected load signal is to be substantially synchronized with a center of the data eye.

24. A device according to claim 22, wherein selection of one of the plurality of load signals comprises:
reception of an offset signal;
selection of a load signal output from one of the one or more delay elements based on the offset signal.

25. A device according to claim 17, wherein input of the load pulse comprises:
assertion of an enable signal to input the load signal into the ring counter, and the device further to:
deassert the enable signal to shift the load signal through the ring counter.

26. A system comprising:

a memory controller hub comprising:

a synchronization circuit to receive a synchronization signal, the synchronization signal substantially synchronized with a data transition, to synchronize the synchronization signal with a clock signal, and to generate a load signal based on the synchronized synchronization signal;

a ring counter to receive the load signal from the synchronization circuit and to circularly propagate the load signal; and a parallel-to-serial converter to generate serial data based on the load signal; and a double data rate memory to receive the serial data.

27. A system according to claim 26, wherein the ring counter comprises one or more delay elements to receive the load signal, to delay the load signal, and to output the delayed load signal, and wherein the memory controller hub further comprises a multiplexer to receive a delayed load signal from a plurality of the one or more delay elements, to receive an offset signal, and to output one of the received delayed load signals based on the offset signal.

* * * * *